(12) United States Patent
Lee

(10) Patent No.: US 7,381,640 B2
(45) Date of Patent: Jun. 3, 2008

(54) METHOD OF FORMING METAL LINE AND CONTACT PLUG OF FLASH MEMORY DEVICE

(75) Inventor: Sung Hoon Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 204 days.

(21) Appl. No.: 11/483,797

(22) Filed: Jul. 10, 2006

(65) Prior Publication Data

US 2007/0015317 A1 Jan. 18, 2007

(30) Foreign Application Priority Data

Jul. 14, 2005 (KR) .................... 10-2005-0063713

(51) Int. Cl.
*H01L 21/4763* (2006.01)
(52) U.S. Cl. ...................... 438/637; 438/735
(58) Field of Classification Search ............... 438/618, 438/622, 637, 672, 674, 675, 735, 736, 737, 438/740
See application file for complete search history.

(56) References Cited

U.S. PATENT DOCUMENTS

| 6,498,089 | B2* | 12/2002 | Komada ................. 438/618 |
| 6,803,318 | B1* | 10/2004 | Qiao et al. ............... 438/700 |
| 6,887,785 | B1* | 5/2005 | Dobuzinsky et al. ....... 438/638 |
| 6,900,123 | B2* | 5/2005 | Jiang et al. .............. 438/636 |
| 7,132,720 | B2* | 11/2006 | Yoshizawa et al. ........ 257/409 |
| 7,309,654 | B2* | 12/2007 | Schaller et al. ........... 438/700 |
| 2004/0157460 | A1 | 8/2004 | Tanaka et al. ............ 438/710 |
| 2004/0185655 | A1 | 9/2004 | Jiang et al. .............. 438/636 |
| 2005/0032354 | A1 | 2/2005 | Chu et al. ................ 438/636 |

* cited by examiner

*Primary Examiner*—Kevin M Picardat
(74) *Attorney, Agent, or Firm*—Marshall, Gerstein & Borun LLP

(57) ABSTRACT

A method of forming a metal line and a contact plug of a flash memory device, wherein if first, second, and third etch processes are performed on an anti-reflection film and regions (a region in which a contact plug through which a gate is exposed is formed/a region in which a contact plug through which a semiconductor substrate is exposed is formed), which have different etch targets and have an irregular thickness, the loss of a semiconductor substrate can be minimized and an increase in the resistance of the contact plugs can be prevented. Furthermore, by reducing variation in the depth of the contact plugs, the reliability of devices can be improved.

18 Claims, 2 Drawing Sheets

METHOD OF FORMING METAL LINE AND CONTACT PLUG OF FLASH MEMORY DEVICE

BACKGROUND

1. Field of the Invention

The invention generally relates to a method of manufacturing semiconductor devices and, more particularly, to a method of forming a metal line and a contact plug of a flash memory device.

2. Discussion of Related Art

The process of forming a contact plug and a metal line may be performed through a trench first dual damascene process of a flash memory device formation process. The contact plugs are formed in regions having different etch targets at the same time, such as a contact plug through gate electrodes are exposed, and a contact plug through which a semiconductor substrate is exposed.

The trench first dual damascene process includes a contact hole formation process of forming a trench in order to expose an underlying conductive material and forming a mask for defining a contact hole on the resulting surface in which the trench is formed. An anti-reflection film is used in the process of forming the mask. The anti-reflection film is deposited irregularly in terms of its deposition characteristic.

Therefore, an anti-reflection film having an irregular thickness is formed on the walls of the trench, and the mask for defining the contact hole is formed in the irregular anti-reflection film.

If an etch process is performed on the irregular anti-reflection film and the regions, which have different etch targets, however, a problem arises because an unwanted film quality is removed after the formation of the contact hole.

Accordingly, the removal of the unwanted film quality may result in degradation in the reliability of the device.

GENERAL DESCRIPTION OF THE INVENTION

In one embodiment, the invention provides a method of forming a metal line and a contact plug of a flash memory device which can minimize a reduction in the reliability of the device in the process of forming the contact plug and the metal line through the trench first dual damascene process.

A method of forming a metal line and a contact plug of a flash memory device according to an embodiment of the invention includes the steps of:

providing a gate, a first region in which a contact plug through which the gate is exposed will be formed, and a second region in which a contact plug through which a semiconductor substrate is exposed will be formed, the first and second regions being formed in the semiconductor substrate in which the gate is formed;

forming a first etch-stop film, a first interlayer insulating layer, a second etch-stop film, and a second interlayer insulating film on the resulting surface, patterning the second interlayer insulating film and the second etch-stop film to form a trench for a metal line, and forming an anti-reflection film and a pattern for defining a contact hole on the resulting surface in which the trench is formed;

etching the anti-reflection film and the first interlayer insulating layer by performing a first etch process using the pattern as an etch mask, so that first and second holes are formed in the first region and third and fourth holes are formed in the second region, wherein the first and third holes have a similar depth and the second and fourth holes have a similar depth;

etching the first interlayer insulating film by performing a second etch process using the pattern as an etch mask, wherein the third and fourth holes have a similar depth; and, etching the first etch-stop film by performing a third etch process using the pattern as an etch mask so that the semiconductor substrate is exposed through the third and fourth holes, wherein contact holes in which a contact plug through which the gate is exposed will be formed are defined in the first and second holes, respectively, and contact holes in which a contact plug through which the semiconductor substrate is exposed will be formed are defined in the third and fourth holes, respectively.

The second etch process may be performed until the first etch-stop film is exposed.

The third etch process may be performed until the semiconductor substrate is exposed.

The gate may preferably be exposed through the second hole during the first etch process.

The gate may preferably be exposed through the first hole during the third etch process.

The method may preferably further include the step of forming contact holes in which the contact plug through which the gate is exposed will be formed and contact holes in which the contact plug through which the semiconductor substrate is exposed will be formed, and burying a metal material in the trench to form the contact plug and the metal line.

The first etch process may preferably be performed using an etch selectivity for reducing an etch amount of the first interlayer insulating layer when the anti-reflection film is etched.

The first etch process may preferably be performed with an etch selectivity of the interlayer insulating layer to the anti-reflection film being set to 1:1 to 1:2.

The first etch process may preferably be performed using a mixed gas of a $CF_4$-based gas, a $CHF_3$-based gas, and$_a$ a $CH_2F_2$-based gas, and an $O_2$ gas as main etch gas.

The first etch process may preferably employ process conditions such as a bias power of 100 W to 500 W and a source power of 500 to 1500 W.

The second etch process may preferably be performed using an etch selectivity for reducing an etch amount of the first etch-stop film is etched.

The second etch process may preferably be performed with the etch selectivity of the first interlayer insulating film to the first etch-stop film being set to 5:1 to 15:1.

The second etch process may preferably employ any one of a $C_4F_6$-based gas, a $C_4F_8$-based gas, and a $C_5F_8$-based gas as a main etch gas, and a mixed gas of an $O_2$ gas, a CO gas, and an Ar gas as an etch gas.

The second etch process may preferably be performed under process conditions such as a bias power of 1000 W to 1500 W and a source power of 1000 W to 2000 W.

The third etch process may preferably be performed using an etch selectivity for reducing an etch amount of the semiconductor substrate.

The third etch process may preferably be performed with an etch selectivity of the first etch-stop film to the semiconductor substrate being set to 5:1 to 15:1.

The third etch process may preferably employ any one of a $C_4F_6$-based gas, a $C_4F_8$-based gas, and a $C_5F_8$-based gas as a main etch gas, and a mixed gas of an $O_2$ gas, a CO gas, and an Ar gas as an etch gas.

The third etch process may preferably be performed under process conditions such as a bias power of 100 W to 2000 W, a source power of 500 W to 2000 W, and/or a pressure of 10 mT to 50 mT.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 1 to 6 are cross-sectional views illustrating a method of forming metal lines and contact plugs of a flash memory device according to an embodiment of the invention.

DETAILED DESCRIPTION OF EMBODIMENTS

Figure 1:
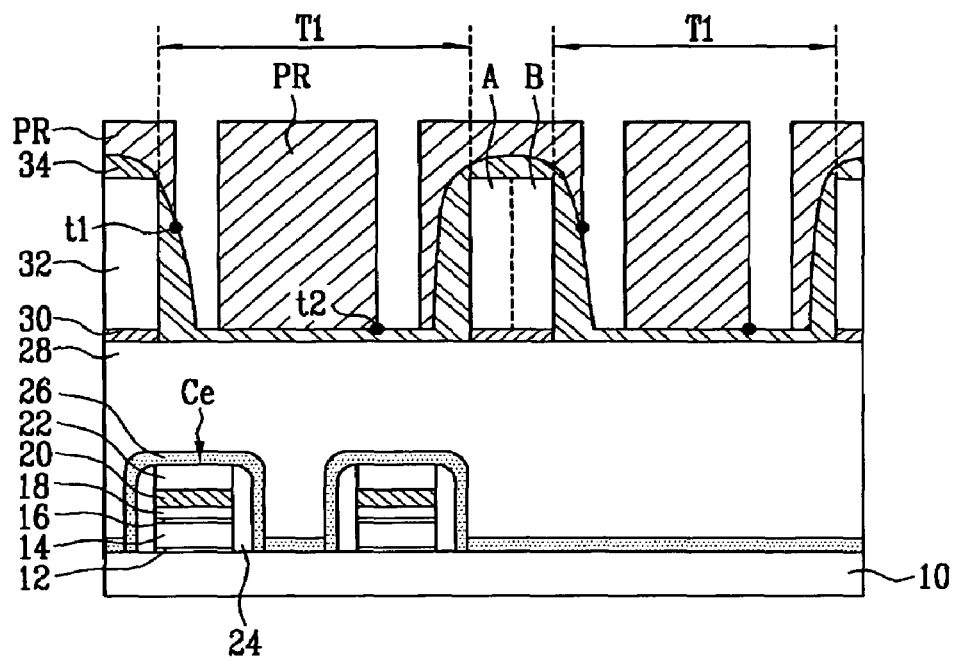

The invention will be described in detail in connection with certain exemplary embodiments with reference to the accompanying drawings. To clarify multiple layers and regions, the thickness of the layers is enlarged in the drawings. Like reference numerals designate like elements throughout the specification. Furthermore, when it is said that any part, such as a layer, film, area, or plate, is positioned on another part, it means the part is directly on the other part or above the other part with at least one intermediate part. On the other hand, if any part is said to be positioned directly on another part it means that there is no intermediate part between the two parts.

FIGS. 1 to 4 are cross-sectional views illustrating a method of forming metal lines and contact plugs of a flash memory device according to an embodiment of the invention.

Referring to FIG. 1, a memory cell Ce, a drain select gate electrode (not shown), a source select gate electrode (not shown), and so on are formed in a cell region of a semiconductor substrate 10. A gate electrode for a peripheral circuit region (not shown), and the like are formed in a peripheral circuit region.

Junction regions (not shown) are formed in the semiconductor substrate of regions respectively adjacent to the memory cell, the drain select gate, the source select gate, and the gate for low voltage. The gates are separated by insulating layers for spacers 24, respectively.

The memory cell has a stack gate electrode in which a tunnel oxide film 12, a silicon film 14 for a floating gate electrode, an ONO film 16, a silicon film 18 for a control gate electrode, a metal silicide film 20 (i.e., a tungsten silicide film), and a nitride film 22 (i.e., a hard mask) are stacked.

In general, contact plugs that are desired to be formed in the flash memory device may be generally classified into a contact plug through which the memory cell, and the gates, such as the drain select gate, the source select gate, and the gate for low voltage, are exposed, a contact plug through which an active region in which the elements are not formed is exposed, and a contact plug through which the junction regions are exposed. In the embodiment, the contact plug through which the gate is exposed and the contact plug through which the active region is exposed will be described as examples.

Reference "A" shown in FIG. 1 denotes a region in which the contact plug through which the gate is exposed is formed. Reference "B" denotes a region in which the contact plug through which the active region is exposed is formed.

A nitride film 26 (i.e., a first etch-stop film), a first interlayer insulating film 28 for defining the contact plug, a nitride film 30 (i.e., a second etch-stop film), and a second interlayer insulating film 32 for defining the metal line are sequentially formed on the resulting surface.

Thereafter, a photoresist pattern (not shown) for defining a trench for the metal line is formed on the second interlayer insulating film 32. The second interlayer insulating film 32 and the second etch-stop film 30 are etched using the pattern as an etch mask, forming a trench T1 for the metal line.

In the process, the metal line and the contact plug are formed through the trench first dual damascene process.

An anti-reflection film 34, and a photoresist pattern for defining the contact hole are formed on the resulting surface in which the trench T1 is formed.

If the anti-reflection film 34 is formed in the trench TI, the anti-reflection film is irregularly deposited on the walls of the trench as show in FIG. 1.

Figure 2:
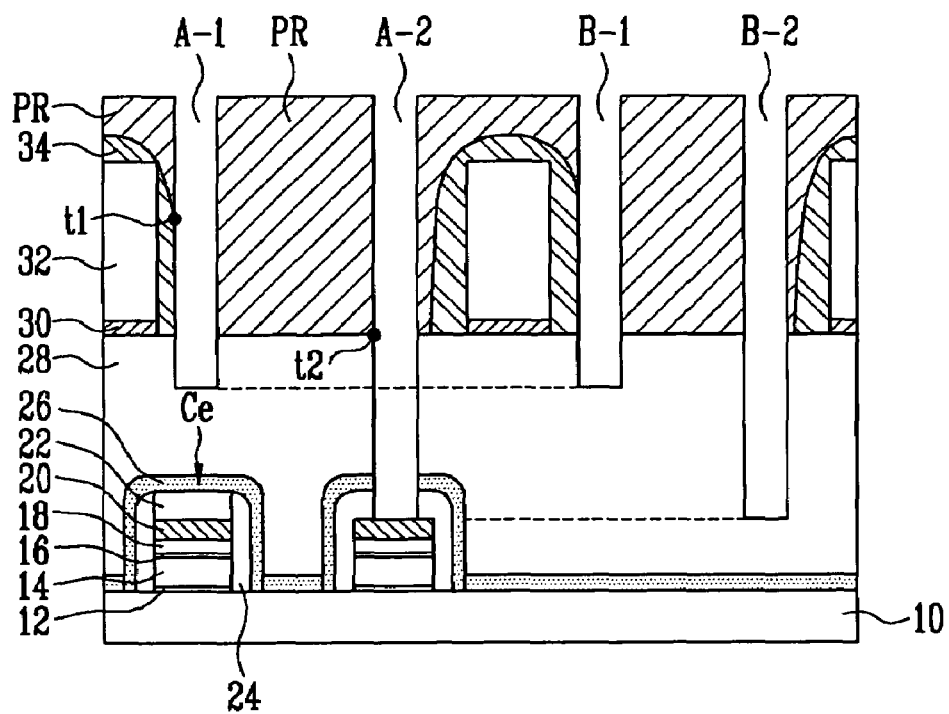

Referring to FIG. 2, a first etch process using the photoresist pattern RP as an etch mask is performed on portions of the anti-reflection film 34 and the first interlayer insulating layer 28, thereby forming a portion of a hole A-1 and a portion of a hole A-2 in the region A, and a portion of a hole B-1 and a portion of a hole B-2 in the region B.

The hole A-1 of the region A and the hole B-1 of the region B have a similar hole depth. The hole A-2 of the region A and the hole B-2 of the region B also have a similar hole depth.

After the photoresist pattern RP is formed, an etch process is performed on the anti-reflection film 34 that is irregularly deposited using the pattern RP as an etch mask. This causes an etch target of the anti-reflection film to vary.

Therefore, the contact hole formation process may be preferably performed by setting the etch target of the anti-reflection film to be different.

That is, if it is desired that the contact hole be formed at a point close to the side of the trench T1, the etch process may be performed to form the holes A-1, B-1 with the etch target being set to a point t1 of the anti-reflection film. If it is desired that the contact hole be formed at a point close to the center of the trench T1, the etch process may be performed to form the holes A-2, B-2 with the etch target being set to a point t2 of the anti-reflection film.

At this time, the etch process in which the etch target is set to the point t1 and the etch process in which the etch target is set to the point t2 are carried out using the same etchant during the same time. Accordingly, a thickness of a film etched by the etch process in which the etch target is set to the point t2 is deeper than that of a film etched by the etch process in which the etch target is set to the point t1.

In other words, an etch thickness of the anti-reflection film in the etch process in which the etch target is set to the point t1 is thicker than that of the anti-reflection film in the etch process in which the etch target is set to the point t2. Accordingly, while the bottom of the anti-reflection film of the point t1 is etched, the etching of the anti-reflection film at the point t2 has already been stopped and the etching of the oxide film is in progress.

Therefore, in the etch process of the oxide film, which is performed after the anti-reflection film is etched, the etch thickness of the oxide film at the point t1 is thicker than that of the oxide film at the point t2.

In the illustrated embodiment, the etch selectivity of the oxide film versus the anti-reflection film must be 1:2 or less. This is for the purpose of reducing an amount of the oxide film at the point t2, which is etched when the anti-reflection film of the point t1 is etched.

Accordingly, the difference between a thickness of the oxide film etched at the point t1 and a thickness of the oxide film etched at the point t2 can be overcome by subsequent etch processes for forming the contact hole.

Meanwhile, an example in which the nitride film 26, the nitride film 22, and the tungsten silicide film 20 of a predetermined thickness are etched in the region A (A-2) when the etch process is performed with the etch target being set to the point t2 is shown in FIG. 2. However, there may be an example in which only up to the oxide film 28 on the nitride film 26 is etched or an example in which the nitride film 26 and the nitride film 22 are etched.

It is, however, required that a depth of the contact hole on which the etch process is performed with the point t2 being set as the etch target be similar in the region A and the region B.

The first etch process may preferably be performed using $CF_4$, $CHF_3$ or $CH_3F_2$-based gas and $O_2$ gas as main etch gases. More preferably, the ratio of the $CHF_3$ or $CH_3F_2$-based gas may be relatively higher than that of $CF_4$ gas, or the ratio of $O_2$ gas may be increased compared with the whole gas ratio.

Furthermore, Ar gas is not used in the first etch process.

In addition, the first etch process may be performed under process conditions employs process conditions, such as a bias power of about 100 W to 500 W and a source power of about 500 W to 1500 W.

Figure 3:
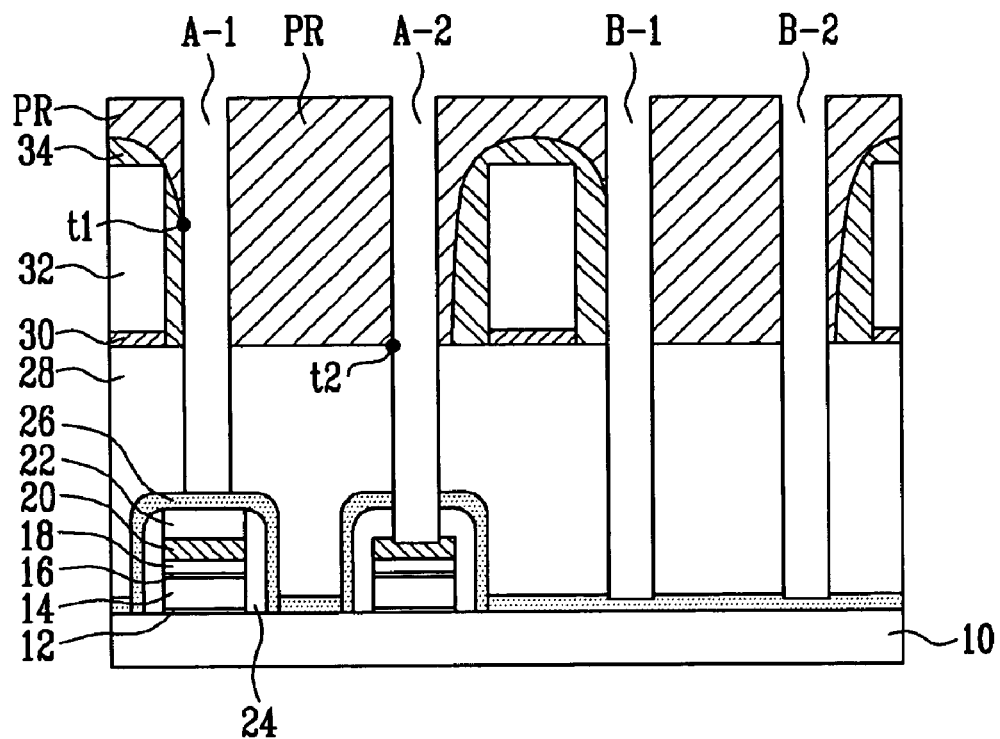

Referring to FIG. 3, a second etch process is performed on the resulting surface in which the hole A-1, the hole A-2, the hole B-1, and the hole B-2 are formed.

The second etch process is performed on the oxide film 28 (i.e., the first interlayer insulating layer) in which the holes A-1, A-2, B-1, and B-2 are formed, but is performed until the nitride film 26 (i.e., the first etch-stop film) is exposed.

In other words, in the hole A-1, the etch process is stopped on the nitride film 26 formed on the memory cell Ce. In the holes B-1, B-2, the etch process is stopped on the nitride film 26 formed on the semiconductor substrate.

Furthermore, the hole A-2 is etched up to the tungsten silicide film 18 of a predetermined thickness as shown in FIG. 2.

The difference between the thickness of the oxide film etched at the point t1 and the thickness of the oxide film etched at the point t2 can be overcome due to the second etch process that is performed until the nitride film 26 is exposed. That is, the depths of the holes B-1, B-2 of the region B must be similar.

The reason why the etch selectivity of the oxide film 28 to the nitride film 26 in the second etch process is set to 5:1 or higher is for reducing an amount of the nitride film, which is etched during the etch process.

The second etch process may preferably employ process conditions using $C_4F_6$, $C_4F_8$ and $C_5F_8$-based gases, and $O_2$, CO or Ar gas as main etch gases, and a bias power of about 1000 W to about 1500 W and a source power of about 1000 W to about 2000 W.

Figure 4:
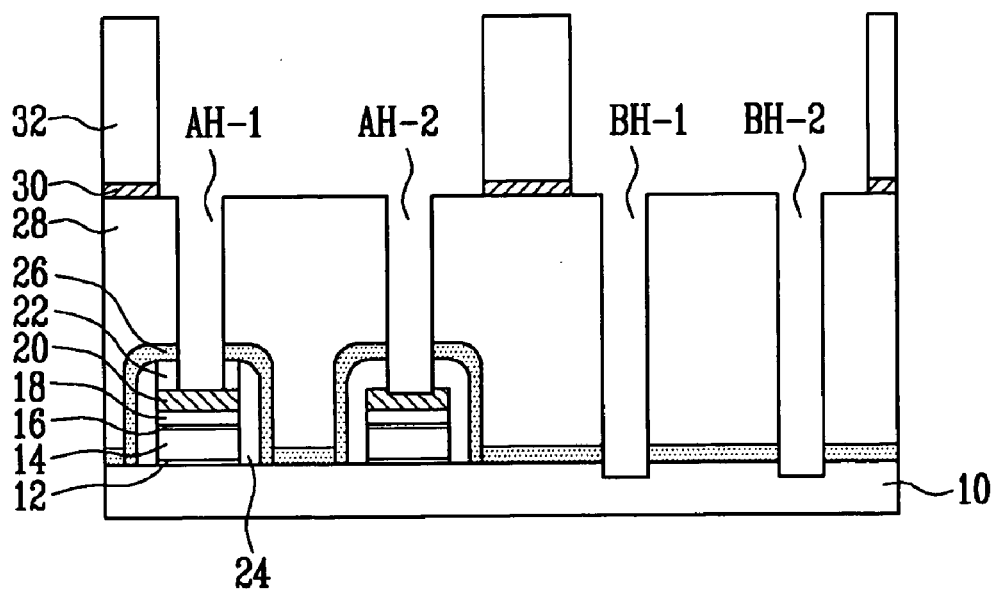

Referring to FIG. 4, a third etch process is performed on the exposed nitride film 26 in the resulting surface in which portions of the holes A-1, A-2, B-1, and B-2 are etched, thus forming contact holes AH-1, AH-2, BH-1, and BH-2.

An ashing process for forming the photoresist pattern RP is then performed.

Though not shown in the drawings, a metal film, such as a copper film, is deposited on the contact holes to form the contact plug, thereby completing the process.

The contact holes AH-1, AH-2 are contact holes in which the contact plug through which the region A (i.e., the gates) is exposed is formed. The contact holes BH-1, BH-2 are contact holes in which the contact plug through which the region B (i.e., the active region) is exposed is formed.

Meanwhile, if the third etch process is performed on the hole A-1 in which the etch process has been stopped on the nitride film 26 on the memory cell Ce, the nitride film 26 (i.e., the etch-stop film) and the nitride film 22 for the hard mask are etched to form the contact hole AH-1 through which the tungsten silicide film 20 of the memory cell Ce is exposed.

Furthermore, although the third etch process is performed on the hole A-2 through which the tungsten silicide film 18 is exposed, the tungsten silicide film is not etched. Accordingly, the contact hole AH-2 through which the tungsten silicide film 20 is exposed is obtained with the hole A-2 remaining without change.

Furthermore, if the third etch process is performed on the holes B-1, B-2 having a similar depth through the second etch process, the nitride film 26 and a predetermined thickness of the semiconductor substrate 10 are etched to form the contact holes BH-1, BH-2 in which the semiconductor substrate is etched in a similar thickness.

If the third etch process is performed, the depths of the holes B-1, B-2, which are made similar in the second etch process, can be kept intact.

The reason why the etch selectivity of the nitride film 28 to the semiconductor substrate 10 is set to 5:1 or higher during the third etch process is for reducing an amount of the semiconductor substrate 10, which is etched in the etch process.

The third etch process may employ process conditions using $C_4F_6$, $C_4F_8$ and $C_5F_8$-based gases and an $O_2$, CO or Ar gas as main etch gases, a bias power of about 100 W to about 2000 W and a source power of about 500 W to about 2000 W, and a pressure of about 10 mT to 50 mT.

As described above, according to the invention, if the first, second, and third etch processes are performed on the anti-reflection film and the regions (the region in which the contact plug through which the gate is exposed is formed/the region in which the contact plug through which the semiconductor substrate is exposed is formed), which have different etch targets and have an irregular thickness, the loss of the semiconductor substrate can be minimized and an increase in the resistance of the contact plugs can be prevented. Furthermore, by reducing variation in the depth of the contact plugs, the reliability of devices can be improved.

While the invention has been described in connection with practical exemplary embodiments, the invention is not limited to the disclosed embodiments, but, on the contrary, is intended to cover various modifications and equivalent arrangements included within the spirit and scope of the appended claims.

What is claimed is:

1. A method of forming a metal line and a contact plug of a flash memory device, the method comprising the steps of:

providing a gate, a first region in which a contact plug through which the gate is exposed will be formed, and a second region in which a contact plug through which a semiconductor substrate is exposed will be formed, the first and second region being formed in the semiconductor substrate in which the gate is formed;

forming a first etch-stop film, a first interlayer insulating layer, a second etch-stop film, and a second interlayer insulating film on the resulting surface, patterning the second interlayer insulating film and the second etch-stop film to form a trench for a metal line, and forming an anti-reflection film and a pattern for defining a contact hole on the resulting surface in which the trench is formed;

etching the anti-reflection film and the first interlayer insulating layer by performing a first etch process using the pattern as an etch mask, so that first and second holes are formed in the first region and third and fourth holes are formed in the second region, wherein the first and third holes have a similar depth and the second and fourth holes have a similar depth;

etching the first interlayer insulating film by performing a second etch process using the pattern as an etch mask, wherein the third and fourth holes have a similar depth; and etching the first etch-stop film by performing a third etch process using the pattern as an etch mask so that the semiconductor substrate is exposed through the third and fourth holes, wherein contact holes in which a contact plug through which the gate is exposed will be formed are defined in the first and second holes, respectively, and contact holes in which a contact plug through which the semiconductor substrate is exposed will be formed are defined in the third and fourth holes, respectively.

2. The method of claim 1, comprising performing the second etch process until the first etch-stop film is exposed.

3. The method of claim 1, comprising performing the third etch process until the semiconductor substrate is exposed.

4. The method of claim 1, comprising exposing the gate through the second hole during the first etch process.

5. The method of claim 1, comprising exposing the gate through the first hole during the third etch process.

6. The method of claim 1, further comprising the step of forming contact holes in which the contact plug through which the gate is exposed will be formed and contact holes in which the contact plug through which the semiconductor substrate is exposed will be formed, and burying a metal material in the trench to form the contact plug and the metal line.

7. The method of claim 1, comprising performing the first etch process using an etch selectivity for reducing an etch amount of the first interlayer insulating layer when the anti-reflection film is etched.

8. The method of claim 1, comprising performing the first etch process with an etch selectivity of the interlayer insulating layer to the anti-reflection film being set to 1:1 to 1:2.

9. The method of claim 1, comprising performing the first etch process using a mixed gas of a $CF_4$-based gas, a $CHF_3$-based gas, and a $CH_2F_2$-based gas, and an $O_2$ gas as main etch gas.

10. The method of claim 1, wherein the first etch process employs process conditions including a bias power of about 100 W to about 500 W and a source power of about 500 W to about 1500 W.

11. The method of claim 1, comprising performing the second etch process using an etch selectivity for reducing an etch amount of the first etch-stop film is etched.

12. The method of claim 1, comprising performing the second etch process with the etch selectivity of the first interlayer insulating film to the first etch-stop film being set to 5:1 to 15:1.

13. The method of claim 1, wherein the second etch process employs any one of a $C_4F_6$-based gas, a $C_4F_8$-based gas, and a $C_5F_8$-based gas as a main etch gas, and a mixed gas of an $O_2$ gas, a CO gas, and an Ar gas as an etch gas.

14. The method of claim 1, comprising performing the second etch process under process conditions including a bias power of about 1000 W to about 1500 W and a source power of about 1000 W to about 2000 W.

15. The method of claim 1, comprising performing the third etch process using an etch selectivity for reducing an etch amount of the semiconductor substrate.

16. The method of claim 1, comprising performing the third etch process with an etch selectivity of the first etch-stop film to the semiconductor substrate being set to 5:1 to 15:1.

17. The method of claim 1, wherein the third etch process employs any one of a $C_4F_6$-based gas, a $C_4F_8$-based gas, and a $C_5F_8$-based gas as a main etch gas, and a mixed gas of an $O_2$ gas, a CO gas, and an Ar gas as an etch gas.

18. The method of claim 1, comprising performing the third etch process under process conditions including a bias power of about 100 W to about 2000 W, a source power of about 500 W to about 2000 W, and a pressure of about 10 mT to about 50 mT.

* * * * *